United States Patent
Shah et al.

(10) Patent No.: US 12,163,076 B2
(45) Date of Patent: Dec. 10, 2024

(54) SCINTILLATOR MATERIALS COMPRISING LITHIUM, AN ALKALINE EARTH METAL, AND A HALIDE

(71) Applicant: Radiation Monitoring Devices, Inc., Watertown, MA (US)

(72) Inventors: Kanai S. Shah, Watertown, MA (US); Jaroslaw Glodo, Allston, MA (US); Edgar V. Van Loef, Watertown, MA (US); Rastgo Hawrami, Watertown, MA (US); Urmila Shirwadkar, Burlington, MA (US); Lakshmi Soundara Pandian, Arlington, MA (US)

(73) Assignee: Radiation Monitoring Devices, Inc., Watertown, MA (US)

(*) Notice: Subject to any disclaimer, the term of this patent is extended or adjusted under 35 U.S.C. 154(b) by 0 days.

(21) Appl. No.: 16/658,217

(22) Filed: Oct. 21, 2019

(65) Prior Publication Data
US 2020/0224093 A1 Jul. 16, 2020

Related U.S. Application Data

(63) Continuation of application No. 14/329,405, filed on Jul. 11, 2014, now abandoned.

(60) Provisional application No. 61/845,151, filed on Jul. 11, 2013.

(51) Int. Cl.
*C09K 11/77* (2006.01)
*C09K 11/61* (2006.01)
*G01T 1/20* (2006.01)

(52) U.S. Cl.
CPC ........ *C09K 11/7733* (2013.01); *C09K 11/616* (2013.01); *G01T 1/2006* (2013.01)

(58) Field of Classification Search
CPC .. C09K 11/7733; C09K 11/616; G01T 1/2006
See application file for complete search history.

(56) References Cited

U.S. PATENT DOCUMENTS

| | | | | |
|---|---|---|---|---|
| 2001/0030302 A1* | 10/2001 | Struye | ................ | C09K 11/7704 250/581 |
| 2002/0171046 A1* | 11/2002 | Kawabata | .......... | C09K 11/7705 250/484.4 |
| 2002/0175291 A1* | 11/2002 | Reeder | ...................... | G01T 3/06 250/369 |

(Continued)

FOREIGN PATENT DOCUMENTS

| | | | | |
|---|---|---|---|---|
| CN | 101365270 A | * | 2/2009 | ........... C07D 413/14 |
| CN | 101546812 B | * | 10/2010 | ......... H01L 51/0035 |
| JP | 61236890 A | * | 10/1986 | |

OTHER PUBLICATIONS

Beck et al., A Study on AB2X5 Compounds (A: k, In, Ti; B: Sr, Sn, Pb; X: Ci, Br, I), May 1986, Journal of Inorganic and General Chemistry, vol. 536, Issue 5, pp. 35-44 (Year: 1986).*

(Continued)

*Primary Examiner* — David P Porta
*Assistant Examiner* — Casey Bryant
(74) *Attorney, Agent, or Firm* — Wolf, Greenfield & Sacks, P.C.

(57) ABSTRACT

Scintillator compositions comprising lithium, an alkaline earth metal, a halide, and optionally a dopant, and related systems and methods for detecting radiation are disclosed.

11 Claims, 10 Drawing Sheets

(56) References Cited

U.S. PATENT DOCUMENTS

| | | | | |
|---|---|---|---|---|
| 2005/0077479 A1* | 4/2005 | Isoda | ............... | C09K 11/7733 |
| | | | | 250/484.4 |
| 2010/0284166 A1* | 11/2010 | Lee | ................ | C09K 11/642 |
| | | | | 362/84 |
| 2011/0024634 A1* | 2/2011 | Shah | ................ | C09K 11/778 |
| | | | | 250/362 |

OTHER PUBLICATIONS

Kellner, "Di binaren Systeme des Europium(II)—und Strontiumchlorids mit Alkalimetalchloriden nd Thalliumchlroid", 1913, Z. Anorg. Allg. Chem., vol. 37, pp. 137-187 (Year: 1913).*

Iida et al. "Gamma and Neutron Separation Using Emission Wavelengths in Eu:LiCaI Scintillators". Prog. Theor. Exp. Phys. 2023 023H01, p. 1-11. (Year: 2023).*

* cited by examiner

SCINTILLATOR MATERIALS COMPRISING LITHIUM, AN ALKALINE EARTH METAL, AND A HALIDE

RELATED APPLICATIONS

This application is a continuation of U.S. application Ser. No. 14/329,405, filed Jul. 11, 2014, which claims priority to U.S. Provisional Application No. 61/845,151 filed Jul. 11, 2013, which are incorporated herein by reference in their entirety.

FIELD

Disclosed embodiments are generally related to compositions for use as scintillator materials and related methods and systems.

BACKGROUND

Scintillator materials may be used for the detection of radiation including gamma-rays as well as particles like neutrons and alpha particles, amongst others. Radiation detection is of major interest in a host of applications including, but not limited to, nuclear medicine, fundamental physics, industrial gauging, baggage scanners, nondestructive testing, nuclear treaty verification safeguards, nuclear nonproliferation monitoring, and geological exploration. Depending on the specific material and application, a scintillator material may discriminate neutrons from gamma rays that may also reach the detector.

SUMMARY

Scintillator material compositions, and related methods and systems, are described herein.

In some embodiments, a scintillator material composition is provided. The composition comprises lithium; an alkaline earth metal selected from the group consisting of Ca, Sr, Mg, and Ba; and a halide selected from the group consisting of Cl, I and F.

In some embodiments, a scintillator material composition is provided. The composition comprises lithium; an alkaline earth metal selected from the group consisting of Ca, Mg, and Ba; and a halide selected from the group consisting of Cl, Br, I and F.

In some embodiments, a system for detecting radiation is provided. The system comprises a detector comprising a scintillator material comprising lithium, an alkaline earth metal, and a halide. The system also comprises a light detector assembly coupled to the scintillator material to detect a light pulse luminescence from the scintillator material.

In some embodiments, a method of radiation detection is provided. The method comprises providing a detection system. The detection system comprises a detector comprising a scintillator material comprising lithium, an alkaline earth metal, and a halide. The detection system further comprises a light detection assembly coupled to the scintillator material to detect a light pulse luminescence from the scintillator as a measure of a scintillation event. The method further comprises positioning the system such that a radiation source is within a field of view of the system so as to detect emissions from the source; and measuring a scintillation event luminescence signal from the scintillator material with the detection assembly.

Other aspects, embodiments, and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

Figure 1:
FIG. 1 shows a photograph of 16 mm diameter, 5 mm thick $LiSr_2I_5$:Eu crystal, according to some embodiments.

Scintillator materials, as well as related systems, and methods of detection using the same, are described herein. In some embodiments, the scintillator materials comprise lithium, an alkaline earth metal, and a halide. The scintillator materials may optionally further comprise a dopant. The scintillator materials may be used to detect radiation and, in some cases, can provide pulse shape discrimination (PSD) between gamma rays and neutrons. As described further below, the materials exhibit excellent scintillation properties including exceptionally high light yields along with excellent proportionality.

As described above, the scintillator material compositions can comprise lithium, an alkaline earth metal, a halide, and optionally a dopant. It should be understood that these compositions may comprise one or more alkaline earth metals and/or one or more halides. That is, compositions including mixed alkaline earth metals and/or mixed halides are envisioned.

In some embodiments, the alkaline earth metal(s) is(are) selected from the group consisting of Ca, Sr, Mg, and Ba. In some embodiments, the halide(s) is(are) selected from the group consisting of Cl, Br, I and F. In some embodiments, the composition comprises the formula $Li(AE)X_3$ or $Li(AE)_2X_5$, wherein AE is the one or more alkaline earth metal and X is the one or more halide.

In some embodiments, the combination of the alkaline earth metal(s) and halide(s) may be one or more of the following: Ca and Cl, Ca and Br, Ca and I, Ca and F, Sr and Cl, Sr and Br, Sr and I, Sr and F, Mg and Cl, Mg and Br, Mg and I, Mg and F, Ba and Cl, Ba and Br, Ba and I, and Ba and F.

In some cases, the composition comprises one or more of the following: $LiBaI_3$, $LiBaBr_3$, $LiBaCl_3$, $LiBaF_3$, $LiSrI_3$, $LiSrBr_3$, $LiSrC_{13}$, $LiSrF_3$, $LiCaI_3$, $LiCaBr_3$, $LiCaCl_3$, $LiCaF_3$, $LiMgI_3$, $LiMgBr_3$, $LiMgCl_3$, and $LiMgF_3$.

In some cases, the composition comprises one or more of the following: $LiBa_2I_5$, $LiBa_2Br_5$, $LiBa_2Cl_5$, $LiBa_2F_5$, $LiSr_2I_5$, $LiSr_2Br_5$, $LiSr_2Cl_5$, $LiSr_2Fl_5$, $LiCa_2I_5$, $LiCa_2Br_5$, $LiCa_2Cl_5$, $LiCa_2F_5$, $LiMg_2I_5$, $LiMg_2Br_5$, $LiMg_2Cl_5$ and $LiMg_2F_5$.

In a particular embodiment, the composition comprises Li, Sr, and I. In some cases, the composition comprises the formula $LiSr_2I_5$.

In some embodiments, the composition comprises includes a mixture of the compositions described herein.

In some embodiments, the combination of the alkaline earth metal and the halide is not Sr and Br. In some embodiments, the composition is not $LiSr_2Br_5$, optionally doped with Eu.

The scintillator compositions disclosed herein can include a dopant or a mixture of dopants. Dopants can affect certain properties, such as physical properties (e.g., brittleness, etc.) as well as scintillation properties (e.g., luminescence, etc.) of the scintillator composition. The dopant can include, for example, cerium (Ce), praseodymium (Pr), lutetium (Lu), lanthanum (La), europium (Eu), samarium (Sm), strontium (Sr), thallium (Tl), chlorine (Cl), fluorine (F), iodine (I), ytterbium (Yb) and mixtures of any of the dopants. In some embodiments, the dopants are present in certain valence states including, for example, $Ce^{3+}$, $Pr^{3+}$, $Lu^{3+}$, $La^{3+}$, $Eu^{3+}$, $Eu^{2+}$, $Sm^{3+}$, $Sm^{2+}$, $Sr^{2+}$, $Tl^+$, $Cl^-$, $F^-$, $Yb^{3+}$ and $Yb^{2+}$. In some embodiments, Eu and/or Ce may be a preferred dopant. Where certain halides are included as dopants, such dopants will be present in the scintillator composition in addition to those halide(s) already otherwise present in the scintillator compound.

The amount of dopant present will depend on various factors, such as the application for which the scintillator composition is being used; the desired scintillation properties (e.g., emission properties, timing resolution, etc.); and the type of detection device into which the scintillator is being incorporated. For example, the dopant is typically employed at a level in the range of about 0.01% to about 20%, by molar weight. In certain embodiments, the amount of dopant is in the range of about 0.01% to less than about 100% (and any integral number therebetween), or less than about 0.1%, 1.0%, 5.0%, or 20% by molar weight.

In some embodiments, the lithium may be enriched with $^6Li$. Naturally occurring lithium includes approximately 92.5% $^7Li$ and approximately 7.5% $^6Li$. Accordingly, in some embodiments, the lithium employed comprises greater than about 7.5% $^6Li$. For example, $^6Li$ may be present in an amount greater than or equal to about 10%, about 25%, about 50%, about 75%, about 90%, or about 95%. In certain embodiments, the amount of $^6Li$ is in the range of about 7.5% to less than about 100% (and any integral number therebetween).

The disclosed compositions may be prepared in any number of different forms. In some embodiments, the composition is in a crystalline form (e.g., monocrystalline). In some embodiments, the composition is formed as a crystalline structure including, for example, monoclinic, cubic, hexagonal, or any other appropriate crystalline structure. However, the composition can include other forms as well, and the selected form may depend, in part, on the intended end use of the scintillator. For example, a composition can be in a powder form. It can also be prepared in the form of a ceramic or polycrystalline ceramic. Other forms of compositions will be recognized and can include, but are not limited to, glasses, deposits, vapor deposited films, and the like.

A crystal may have any suitable size and shape. Non-limiting examples of shapes include sheets, cubes, cylinders, hollow tubes, spheres, and the like. In some cases, the maximum dimension of the crystal in one dimension may be at least about 1 mm, at least about 2 mm, at least about 5 mm, at least about 10 mm, at least about 50 mm, or at least about 10 cm.

Methods for making the disclosed compositions can include the methods described herein or any other appropriate technique. Typically during the manufacture of many types of scintillator compositions, the appropriate reactants are melted at a temperature sufficient to form a congruent, molten composition. The melting temperature depends on the identity of the reactants themselves (e.g., melting points of reactants), but is usually in the range of about 300° C. to about 1350° C. Non-limiting examples of possible crystal-growing methods include the Bridgman-Stockbarger method; Czochralski growth method, zone-melting growth method (or "floating zone" method), the vertical gradient freeze (VGF) method, and the temperature gradient method. In other embodiments, the scintillator compositions are processed using ceramic processing methods like those disclosed in co-pending application Ser. No. 13/312,841 entitled, "SCINTILLATOR MATERIALS AND RELATED PROCESSES," filed on Dec. 6, 2011, the entirety of is incorporated herein by reference. While specific processing methods have been discussed above, other processing methods may be used for the scintillator compositions disclosed herein.

Following formation of the compositions, crystals may be processed using techniques and methods known to those of ordinary skill in the art. Such processes include cutting, polishing, and/or packaging (e.g., under an inert atmosphere). In addition, the compositions may be analyzed using methods and techniques known to those of ordinary skill in the art to determine the compositional make-up of the compositions, for example, using differential scanning calorimetry (DSC) and/or crystal structure (XRD).

The compositions may be analyzed to determine their general properties and radiation detection. Such methods and techniques may include measurements of their spectroscopy (emission and excitation spectra), radio-luminescence, gamma ray spectroscopy capabilities (energy spectra, light yield, energy resolution), and proportionality. The thermal neutron detection properties for a material may also be determined (e.g., using a moderated Am/Be source or a $^{252}Cf$ source). Non-limiting examples of such properties include pulse height spectra, gamma equivalent energy, energy resolution, decays under gamma and neutron excitation, and/or pulse shape discrimination (PSD, described in more detail herein).

The compositions, methods, and systems described herein may be employed for detecting radiation. In some cases, the radiation is gamma radiation and/or neutron radiation. In some cases, the compositions, methods, and systems may be employed to differentiate neutrons from gamma rays. The timing profile of a gamma-ray scintillation event differs compared to a neutron scintillation event. For incident gamma-rays, scintillation is very fast, including a fast light decay. The neutron scintillation event exhibits a relatively slower timing profile. The difference in the timing profile between gamma-ray scintillation events and neutron scintillation events can facilitate differentiation between gamma-ray detection and neutron detection. In particular, such differences enable gamma-ray detection and neutron detection to be differentiated using pulse shape discrimination (PSD) analysis.

PSD analysis, in general, involves comparing the luminescence signal pulse shape resulting from gamma-ray detection to the luminescence signal pulse shape resulting from neutron detection. In some embodiments, it may be advantageous to use PSD analysis over relatively long time periods to differentiate gamma-ray detection and neutron detection.

The compositions described herein can be used in systems for detecting radiation. The system may comprises a detector include a scintillator material comprising a composition as described herein coupled (e.g., optically coupled) to a light detector assembly (e.g., a light photodetector, an imaging device). In use, the detector detects energetic radiation (e.g., light pulse luminescence) emitted from a source (e.g., the scintillator material).

Non-limiting examples of light detector assemblies include photomultiplier tubes (PMT), photodiodes, CCD sensors, image intensifiers, and the like. Choice of a particular photodetector will depend in part on the type of radiation detector being fabricated and on the intended use of the device. In certain embodiments, the photodetector may be position-sensitive.

A data analysis system may be coupled to the detector. The data analysis system may include, for example, a module or system to process information (e.g., radiation detection information) from the detector/light detector assembly. The data analysis system may also include, for example, a wide variety of proprietary or commercially available computers, electronics, systems having one or more processing structures, or the like. The systems may have data processing hardware and/or software configured to implement any one (or combination of) the method steps described herein. The methods may further be embodied as programming instructions in a tangible non-transitory media such as a memory, a digital or optical recording media, or other appropriate device.

The systems themselves, which can include the detector and the light detector assembly, can be connected to a variety of tools and devices, as mentioned previously. Non-limiting examples include monitoring and detection devices (e.g., for nuclear weapons), physics research devices, well-logging tools, and imaging devices such as X-ray CT, X-ray fluoroscopy, X-ray cameras (such as for security uses), PET, and other nuclear medical imaging or detection devices. Various technologies for operably coupling or integrating a radiation detector assembly containing a scintillator to a detection device can be utilized with the presently disclosed materials, including various known techniques.

The systems may also be connected to a visualization interface, imaging equipment, or digital imaging equipment (e.g., pixilated flat panel devices). In some embodiments, the scintillator may serve as a component of a screen scintillator. For example, powdered scintillator material could be formed into a relatively flat plate, which is attached to a film, such as photographic film. Energetic radiation, e.g., gamma-rays and neutron, originating from a source, would interact with the scintillator and be converted into light photons, which are visualized in the developed film. The film can be replaced by amorphous silicon position-sensitive photodetectors or other position-sensitive detectors, such as avalanche diodes and the like.

In some embodiments, methods of radiation detection are provided. In some embodiments, a method of radiation detection comprises providing a detection system (e.g., as described here), positioning the detection system such that a radiation source is within a field of view of the system so as to detect emissions from the source; and measuring a scintillation event luminescence signal from the scintillator material with the detection assembly. In some embodiments, the detection system comprises a detector comprising a scintillator material as described herein (e.g., comprising lithium, an alkaline earth metal, and a halide), and a light detection assembly coupled to the scintillator material to detect a light pulse luminescence from the scintillator as a measure of a scintillation event.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art. Accordingly, the foregoing description and drawings are by way of example only.

Example 1

The following example described the preparation and characterization of $LiSr_2I_5$ ("LSI") scintillators for dual mode detection. LSI belongs to the alkaline earth halide family and has monoclinic crystal structure. Its melting point is ~560° C. Small crystals (16 mm diameter) of LSI were grown using the Bridgman method that incorporated 0.5% $Eu^{2+}$ doping in the crystal ("LSI:Eu"). The resulting crystal was optically clear without any secondary phases present. FIG. 1 shows a photograph of a 5 mm thick slice of the crystal that was cut from the crystal and then polished for further studies.

Figure 2:
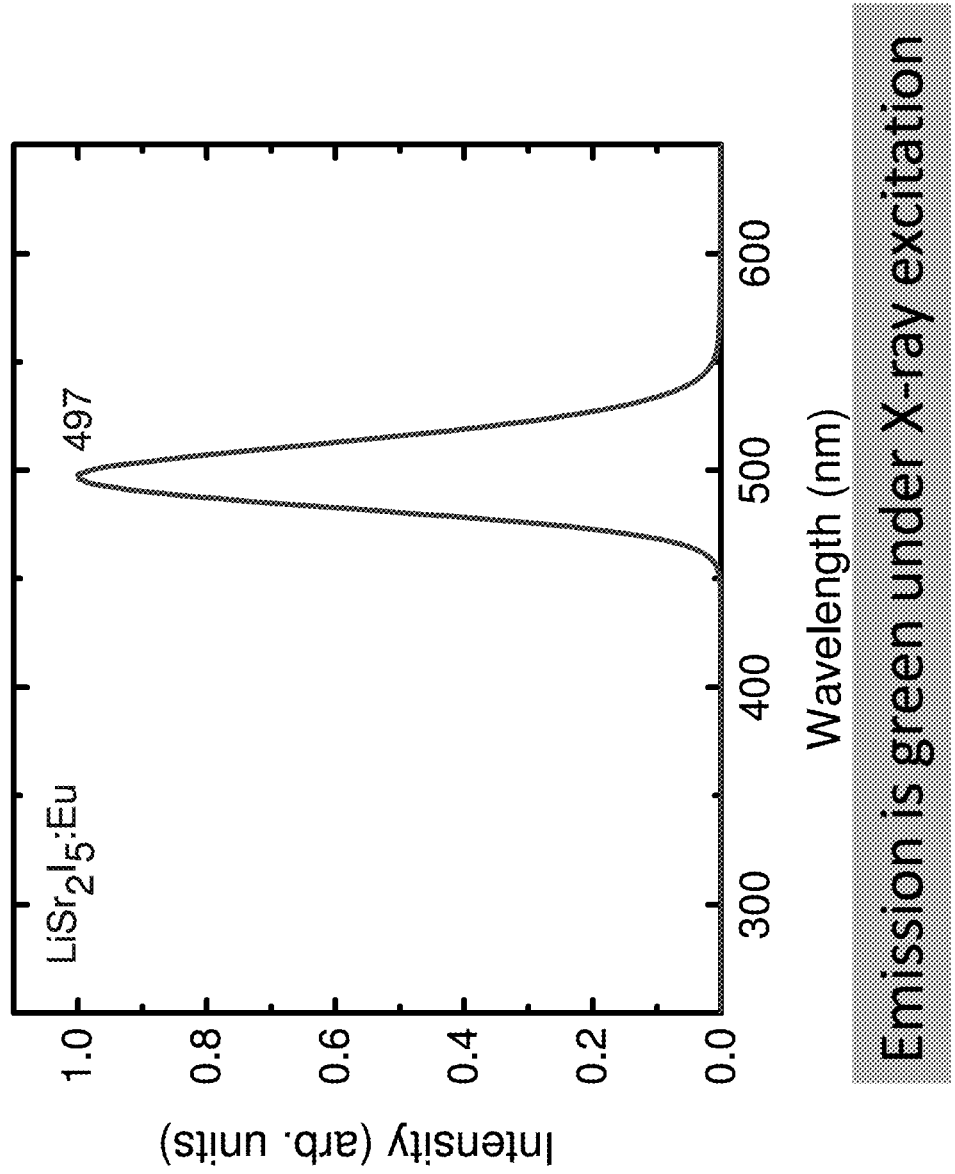
FIG. 2 shows an X-ray excited optical emission spectrum of an $LiSr_2I_5$:Eu crystal, according to some embodiments.

Emission Spectrum:

The optical emission spectrum of $LiSr_2I_5$:Eu scintillator was measured. The crystals were excited with radiation from a Philips X-ray tube having a copper target, with power settings of 40 kVp and 20 mA. The scintillation light was passed through a McPherson 0.2-meter monochromator and detected with a Burle C31034 PMT. The system was calibrated with a standard light source to correct for sensitivity variations as a function of wavelength. FIG. 2 shows the emission spectrum for the $LiSr_2I_5$:Eu crystal. As seen in the figure, the emission occurs over a single band (400-550 nm), which is due to d-f transition of $Eu^{2}±$. The wavelength of the main maximum emission is at 497 nm for $LiSr_2I_5$:Eu, which matches well with the response function of PMTs as well as new Si-photodiodes.

Figure 3:
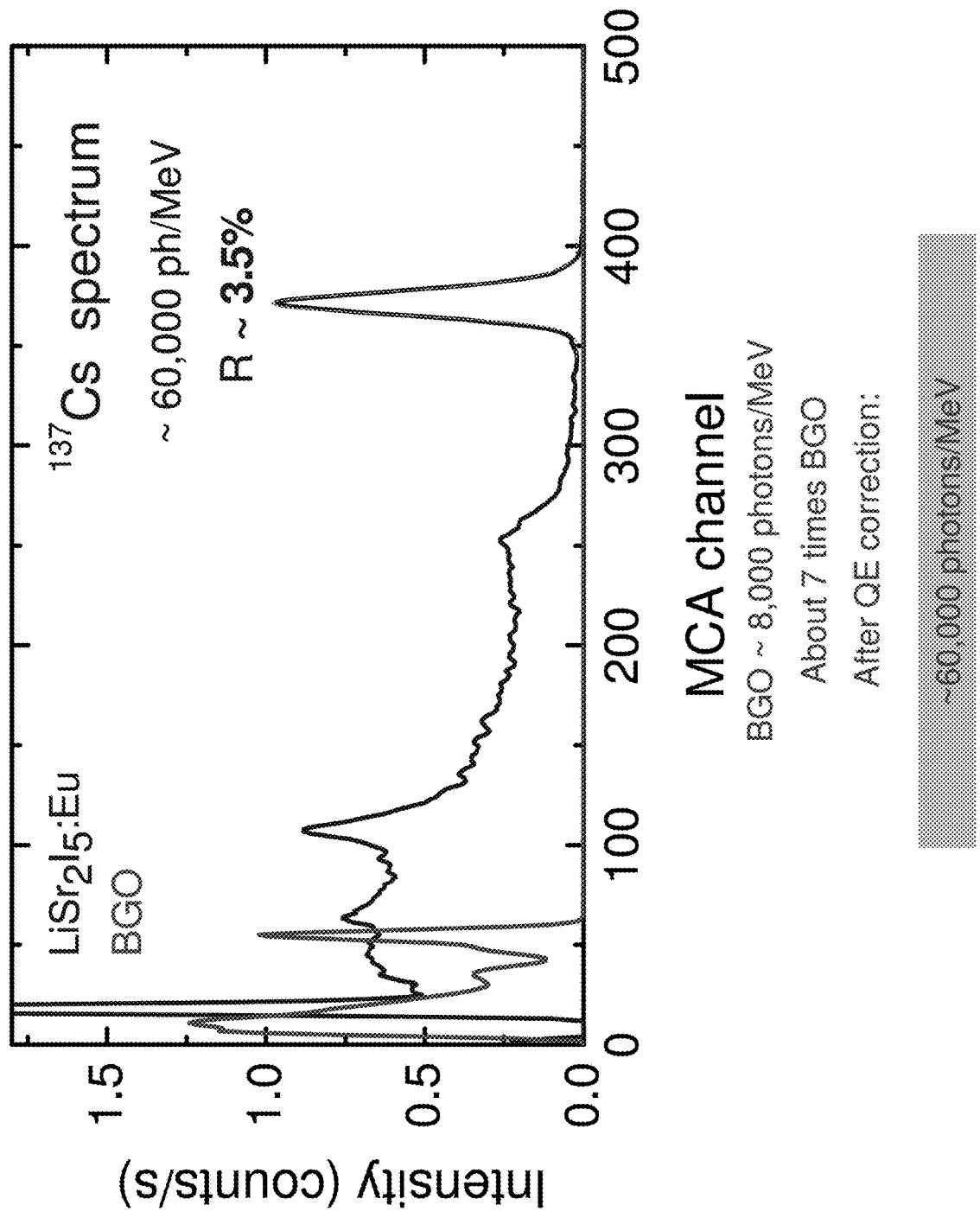
FIG. 3 shows a pulse height spectrum of BGO and $LiSr_2I_5$:Eu under $^{137}$Cs 662 keV gamma-ray excitation, according to some embodiments.

Light Output and Energy Resolution:

The light output of these crystals was measured by comparing their response to that of a calibrated BGO scintillator. A BGO crystal was first coupled to a PMT and a $^{137}Cs$ spectrum was acquired. Next, a $LiSr_2I_5$:Eu crystal was coupled to the same PMT and a $^{137}Cs$ spectrum was collected (see FIG. 3). Based on the calibration provided by BGO and taking into account the quantum efficiency of PMT for BGO and $LiSr_2I_5$:Eu emissions, the light yield of $CsSr_2I_5$:Eu was estimated to be ~60,000 photons/MeV. The energy resolution of $LiSr_2I_5$:Eu is 3.3% (FWHM) at 662 keV (see FIG. 3).

Figure 4:
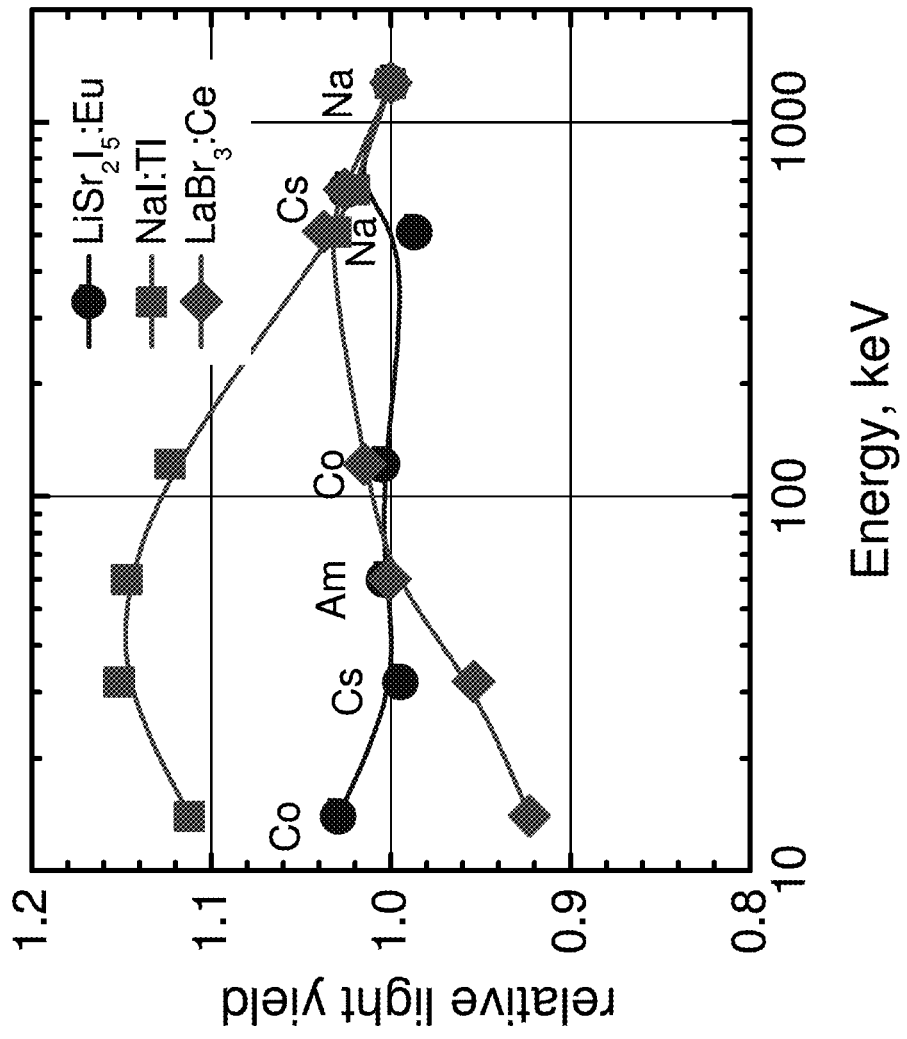
FIG. 4 shows a plot of the proportionality of light yield for $LiSr_2I_5$:Eu crystals, according to some embodiments.

Proportionality Studies:

The proportionality response of $LiSr_2I_5$:Eu was characterized using gamma-ray exposure with isotopic sources such as $^{57}Co$, $^{241}Am$, $^{22}Na$ and $^{137}Cs$. Light output was measured using gamma-rays with energies ranging from 32 keV to 1275 keV and the results normalized with respect to the light output value at 662 keV are shown in FIG. 4. The proportionality of light yield is excellent for $LiSr_2I_5$:Eu.

Figure 5:
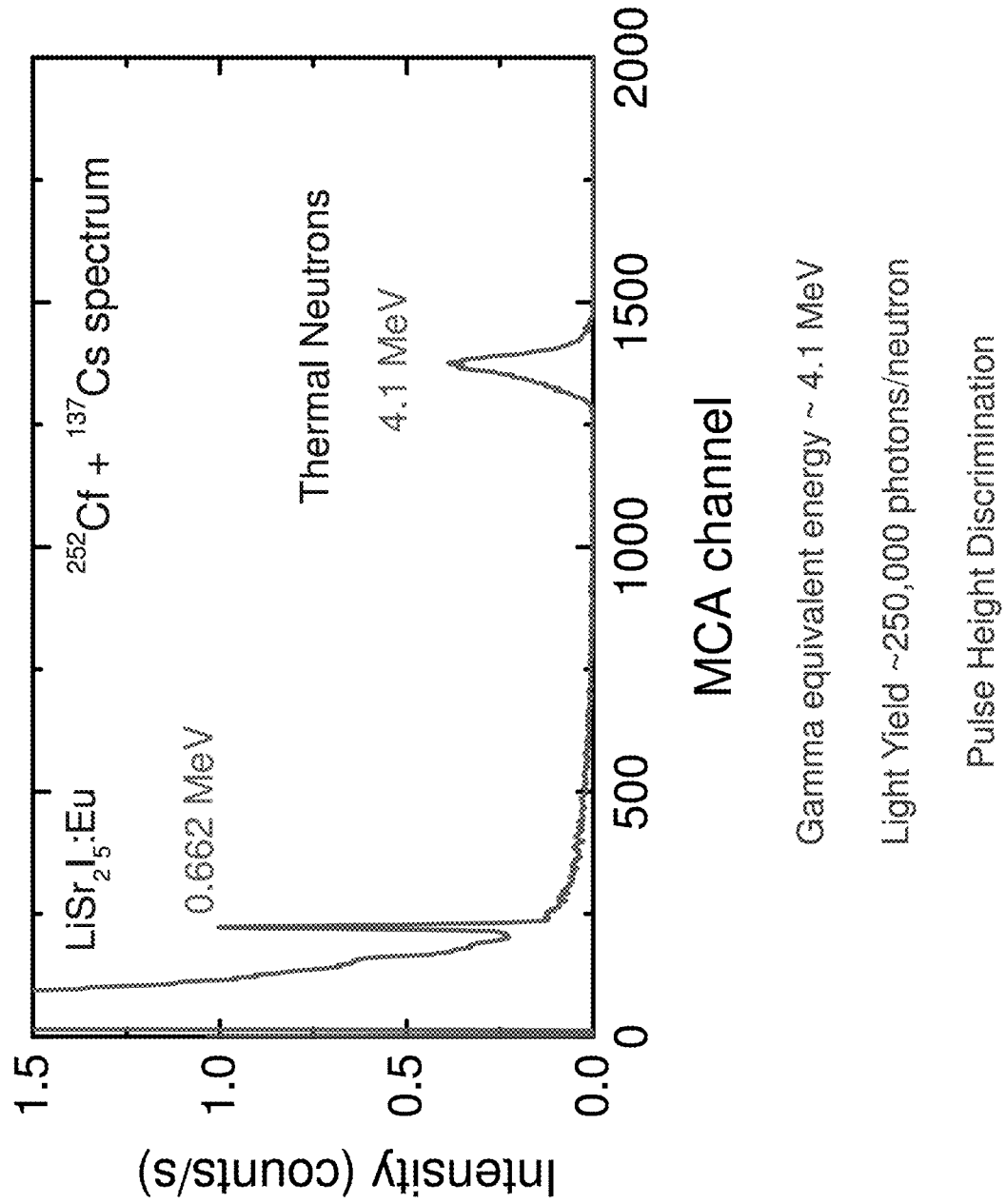
FIG. 5 shows an energy spectra measured under $^{137}$Cs and $^{241}$Am/Be excitations with a $LiSr_2I_5$:Eu, according to some embodiments.

Thermal Neutron Detection:

The detection of a thermal neutron in $LiSr_2I_5$:Eu is the result of thermal neutron capture by $^6Li$ ions. In FIG. 5, an energy spectra measured under combined exposure to $^{137}Cs$ and moderated Am/Be sources is shown. The peak at the right side of the Am/Be spectrum is due to thermal neutrons. Based on the position of the 662 keV peak, the neutron peak appears at ~4.3 MeV gamma equivalent energy (GEE). The higher GEE value for $LiSr_2I_5$:Eu can enable superior gamma rejection on the basis of the pulse shape analysis. It should be noted that the light output of $LiSr_2I_5$:Eu for thermal neutron interaction is >250,000 photons/MeV.

Figure 6:
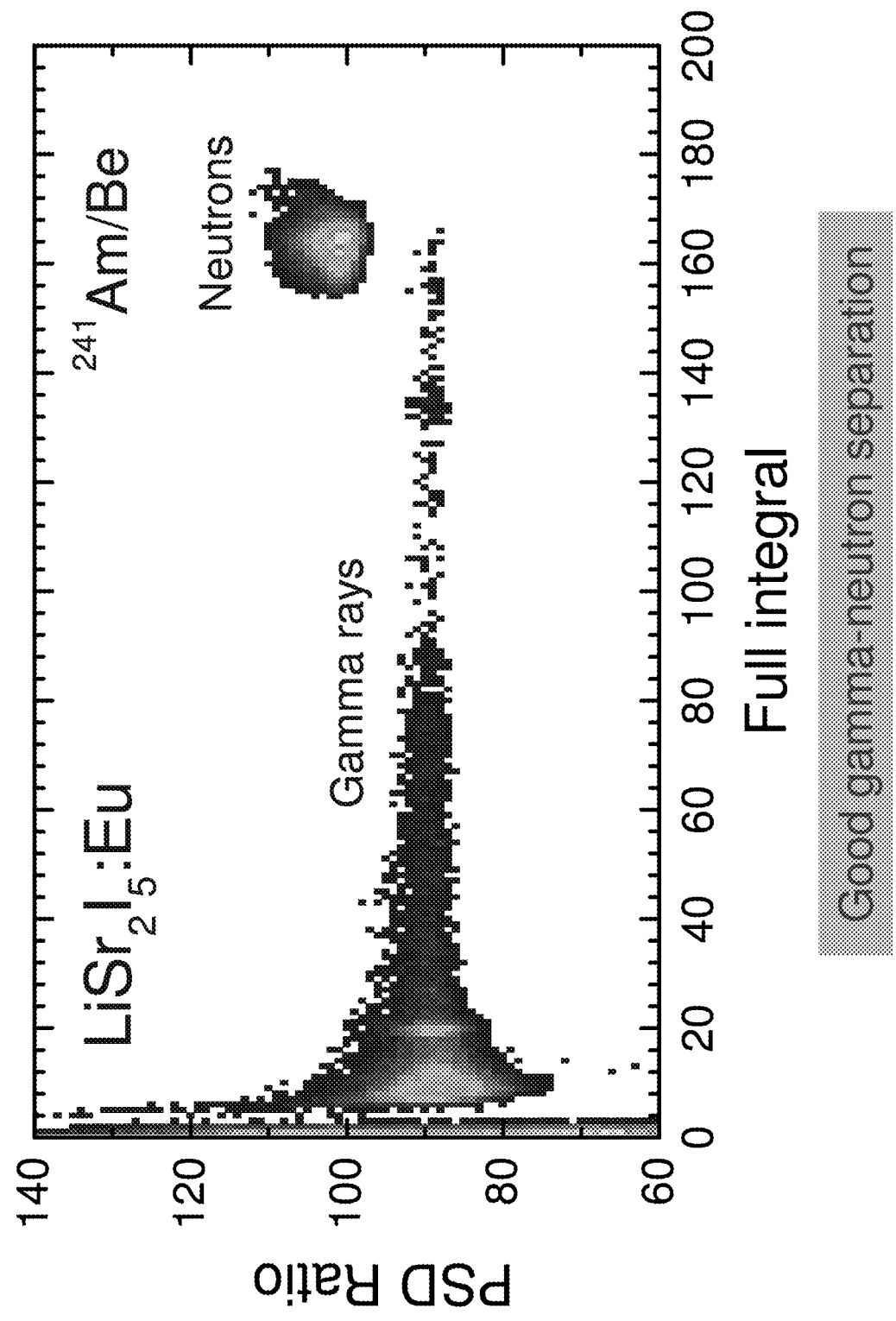
FIG. 6 shows a PSD scatter plot recorded with a $LiSr_2I_5$:Eu under excitation from Am/Be source, according to some embodiments.

Pulse Shape Discrimination:

FIG. 6 presents a PSD scatter plot recorded with $LiSr_2I_5$:Eu. Here each decay trace is processed within two time windows and the ratio of the signal within the two windows is plotted against the full integral for the pulse to create a PSD scatter plot. In the experiment, the $LiSr_2I_5$:Eu crystal was exposed to gamma and thermal neutron radiations from an Am/Be source. The bottom cone shape cluster expanding into a relatively flat band at high values for full integral is due to gamma-events, while the upper oval shape cluster is due to neutron events. This PSD scatter plot clearly demonstrates that gamma and neutron events can be readily discriminated using pulse shape analysis. The estimated PSD Figure-of-Merit is >2 in this study.

The results described in this example for $LiSr_2I_5$:Eu for dual mode detection of gamma-rays and neutrons are summarized in Table 1.

TABLE 1

Detection properties of dual-mode detector materials

|  | $LiSr_2I_5$:Eu |
|---|---|
| Light Yield (γ-ray) ph/MeV | 60,000 |
| Light Yield (no) ph/neutron | >250,000 |
| Energy Resolution at 662 keV) | 3% |
| GEE (per no) | 4.3 |
| PSD capability | Yes |
| no Efficiency (at 1 cm) | >95% |

Example 2

The following example described the preparation and characterization of $LiCa_2Cl_5$, $LiCa_2Br_5$ and $LiCa_2I_5$ scintillators for dual mode detection. The techniques noted in Example 1 were used to characterize the scintillators.

Figure 7A:
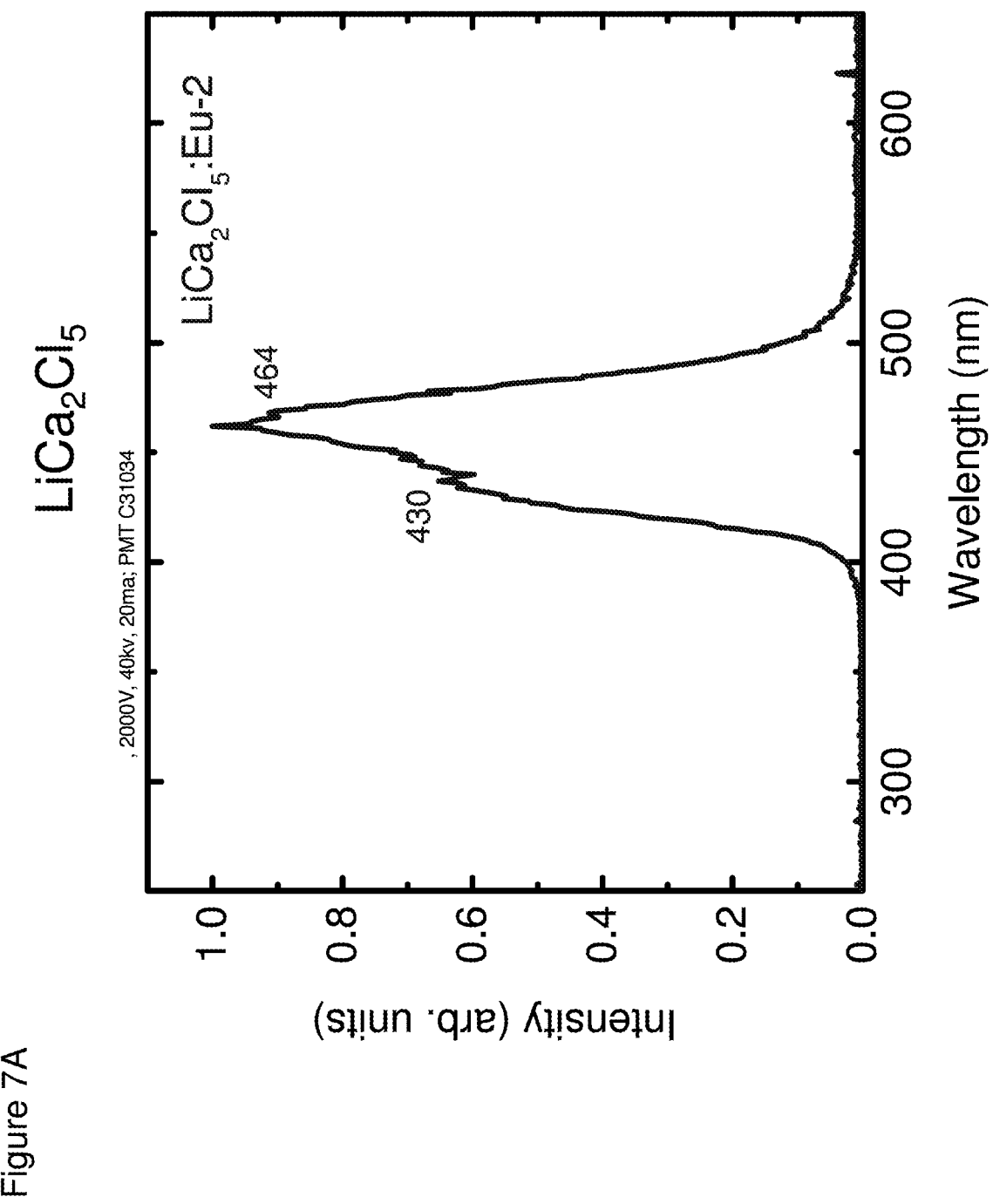
FIGS. 7A-7C respectively show the optical emission spectra for $LiCa_2Cl_5$ (FIG. 7A), $LiCa_2Br_5$ (FIG. 7B) and $LiCa_2I_5$ (FIG. 7C), according to some embodiments.
Figure 7B:
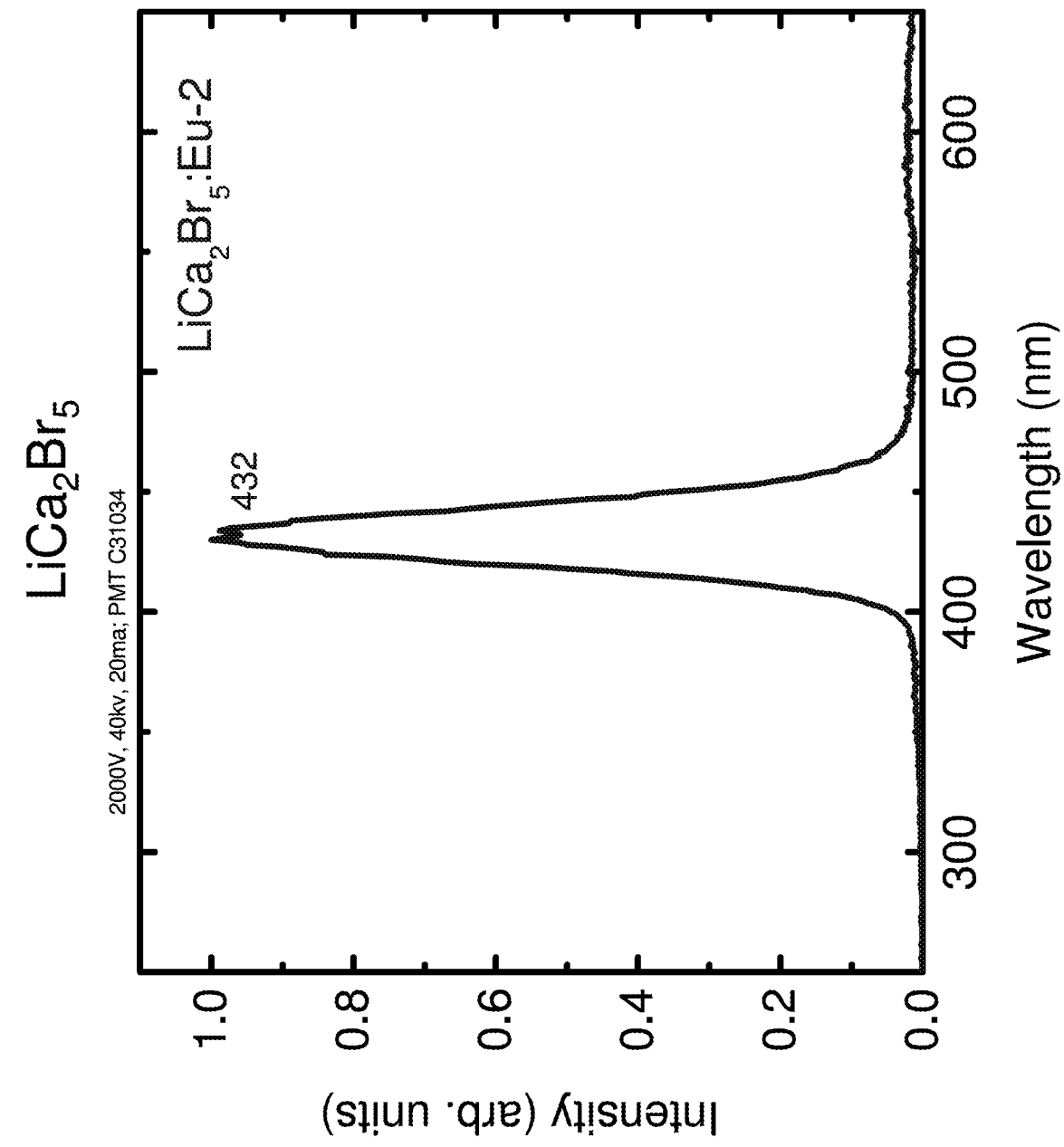
Figure 7C:
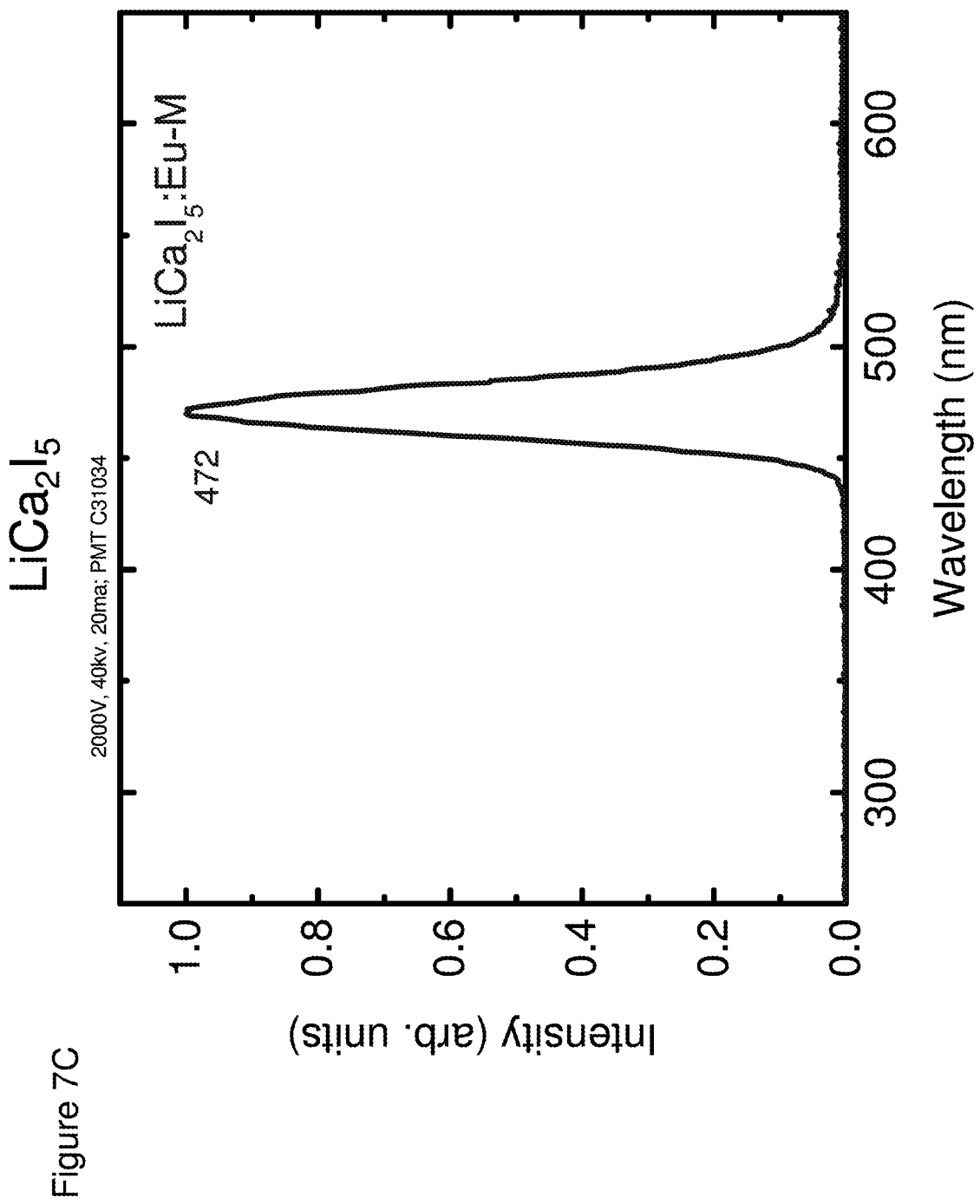

FIGS. 7A-7C respectively show the optical emission spectra for $LiCa_2Cl_5$ (FIG. 7A), $LiCa_2Br_5$ (FIG. 7B) and $LiCa_2I_5$ (FIG. 7C).

Figure 8:
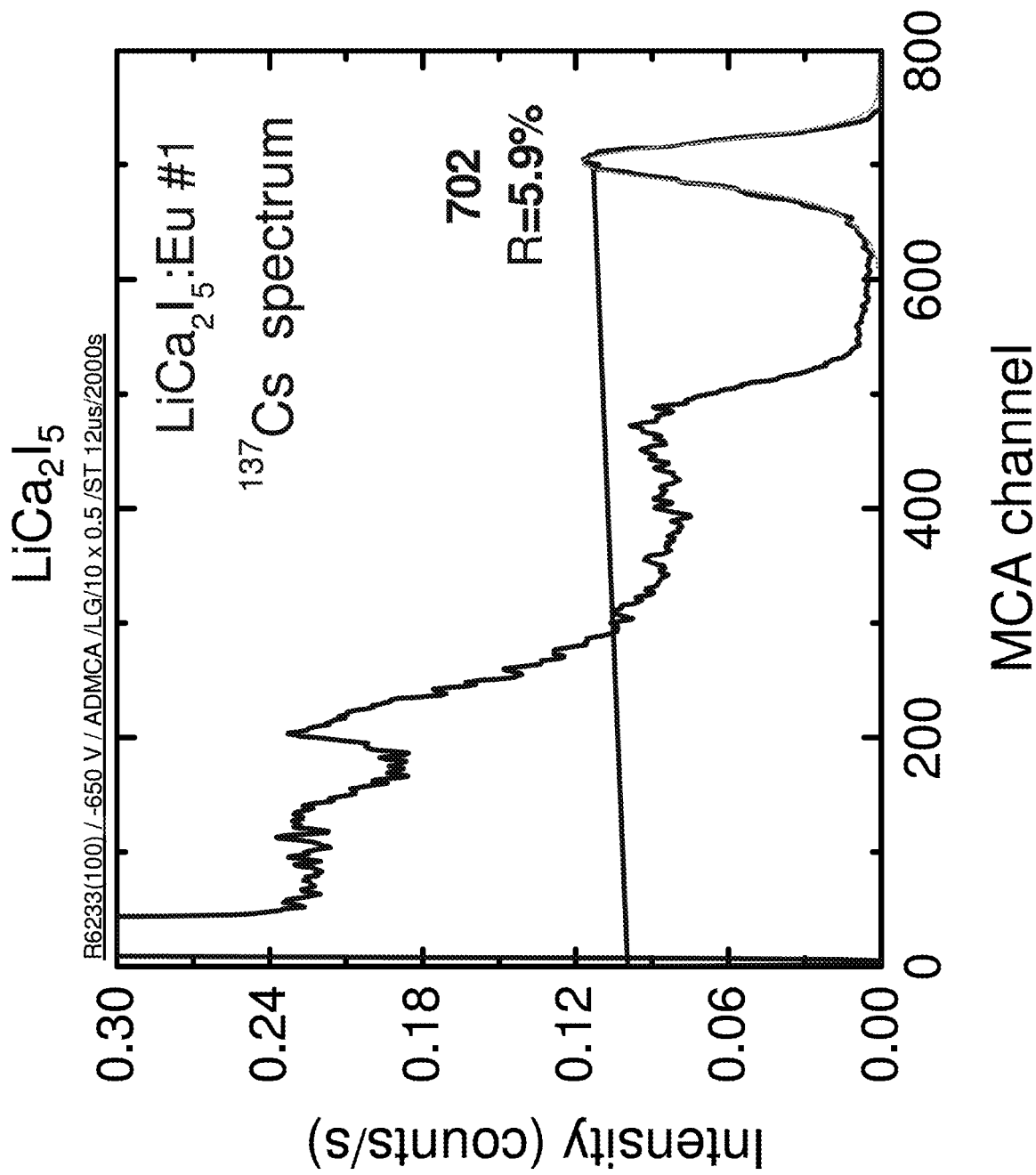
FIG. 8 shows an energy spectra for $LiCa_2I_5$, according to some embodiments.

FIG. 8 shows an energy spectra for $LiCa_2I_5$.

Table 2 below summarizes properties of the scintillators in Example 2.

TABLE 2

Properties

| Composition | Emission (nm) | Light Yield Photons/MeV | Energy Resolution @ 662 keV | Neutron GEE (MeVee) | Decay Times |
|---|---|---|---|---|---|
| $LiCa_2Cl_5$ | 430, 464 | 12,000 | 9% | 1.6 | G: 1.7 μs<br>N: 1.6 μs |
| $LiCa_2Br_5$ | 432 | 18,000 | 9% | 2.4 | G: 37 ns, 1.3 μs<br>N: 94 ns, 1.2 μs |
| $LiCa_2I_5$ | 472 | 90,000 | 6% | 3.0 | G: 1.7 μs<br>N: 25 ns, 1.5 μs |

What is claimed is:

1. A scintillator material composition, comprising:
   lithium;
   strontium;
   iodine; and
   a dopant,
   wherein the composition comprises the formula $LiSr_2I_5$, and
   wherein the dopant is present in an amount between about 0.01% to about 20%, by molar weight.

2. The composition of claim 1, wherein the dopant is selected from one of the following Ce, Pr, Lu, La, Eu, Sm, Sr, Tl, Cl, F, Yb, and I.

3. The composition of claim 1, wherein the dopant comprises a first type of dopant and a second type of dopant.

4. The composition of claim 1, wherein the lithium is enriched with $^6Li$.

5. The composition of claim 1, wherein the composition comprises the formula $LiSr_2I_5$:Eu.

6. A system for detecting radiation, comprising:
   a detector comprising the scintillator material composition of claim 1;
   a light detector assembly coupled to the scintillator material composition to detect a light pulse luminescence from the scintillator material composition.

7. A method of radiation detection, comprising:
   providing a detection system comprising:
     a detector comprising the scintillator material composition of claim 1; and
     a light detection assembly coupled to the scintillator material composition to detect a light pulse luminescence from the scintillator material composition a measure of a scintillation event;
   positioning the system such that a radiation source is within a field of view of the system so as to detect emissions from the source; and
   measuring a scintillation event luminescence signal from the scintillator material composition with the detection assembly.

8. The composition of claim 1, wherein the composition has a monocrystalline structure.

9. A scintillator material composition, comprising:
   lithium;
   calcium;
   one or more halides selected from the group consisting of Cl, Br, and I; and
   a dopant, wherein the composition comprises the formula $LiCa_2X_5$, wherein X the one or more halides, and wherein the dopant is present in an amount between about 0.01% to about 20%, by molar weight.

10. A system for detecting radiation, comprising:
a detector comprising the scintillator material composition of claim 9;
a light detector assembly coupled to the scintillator material composition to detect a light pulse luminescence from the scintillator material composition.

11. A method of radiation detection, comprising:
providing a detection system comprising:
  a detector comprising the scintillator material composition of claim 9; and
  a light detection assembly coupled to the scintillator material composition to detect a light pulse luminescence from the scintillator material composition a measure of a scintillation event;
positioning the system such that a radiation source is within a field of view of the system so as to detect emissions from the source; and
measuring a scintillation event luminescence signal from the scintillator material composition with the detection assembly.

* * * * *